(12) United States Patent
Lim et al.

(10) Patent No.: US 9,064,830 B2
(45) Date of Patent: Jun. 23, 2015

(54) ORGANIC LIGHT EMITTING DIODE DISPLAY

(71) Applicant: SAMSUNG DISPLAY CO., LTD., Yongin, Gyeonggi-Do (KR)

(72) Inventors: Jae-Ik Lim, Gyeonggi-do (KR); Man-Seob Choi, Gyeonggi-do (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/174,947

(22) Filed: Feb. 7, 2014

(65) Prior Publication Data

US 2015/0014650 A1     Jan. 15, 2015

(30) Foreign Application Priority Data

Jul. 9, 2013  (KR) .......................... 10-2013-0080549

(51) Int. Cl.
*H01L 21/00* (2006.01)
*H01L 27/32* (2006.01)

(52) U.S. Cl.
CPC .................................. *H01L 27/3262* (2013.01)

(58) Field of Classification Search
None
See application file for complete search history.

(56) References Cited

U.S. PATENT DOCUMENTS

| 2006/0238862 A1* | 10/2006 | Yano ............................. 359/460 |
| 2011/0193475 A1* | 8/2011 | Kim ............................. 313/504 |
| 2012/0113362 A1* | 5/2012 | Lim et al. ........................ 349/96 |

FOREIGN PATENT DOCUMENTS

| KR | 1020090099248 | 9/2009 |
| KR | 1020110017306 | 2/2011 |
| KR | 1020120049796 | 5/2012 |

* cited by examiner

*Primary Examiner* — Charles Garber
*Assistant Examiner* — Abdulfattah Mustapha
(74) *Attorney, Agent, or Firm* — F. Chau & Associates, LLC

(57) ABSTRACT

An organic light emitting diode (OLED) display includes a transmission region and a reflection region. When external light is incident on the OLED display, a reflection rate of the external light of the reflection region is proportional to luminance of the transmission region. The transmission region includes a pixel electrode, an organic emission layer, and a common electrode. The transmission region is configured to transmit light emitted from the organic emission layer to a first direction. The reflection region includes a control electrode, liquid crystal capsules, and the common electrode. The reflection region is configured to reflect the external light to the first direction.

18 Claims, 9 Drawing Sheets

ORGANIC LIGHT EMITTING DIODE DISPLAY

CROSS-REFERENCE TO RELATED APPLICATION

This application claims priority under 36 U.S.C. §119 to Korean Patent Application No. 10-2013-0080549, filed on Jul. 9, 2013 in the Korean Intellectual Property Office, the disclosure of which is incorporated by reference herein in its entirety.

TECHNICAL FIELD

The present invention relates to an organic light emitting diode (OLED) display.

DISCUSSION OF RELATED ART

Organic light emitting diode (OLED) displays include pixels emitting light using self-emissive organic emission layers. Holes and electrons injected to organic emission layers are combined to generate excitons. Such excitions emit light when discharging energy, When OLED displays increase luminance of emitted light, the OLED displays consume much power,

SUMMARY

According to an exemplary embodiment of the present invention, an organic light emitting diode (OLED) display includes a pixel electrode, a control electrode, a pixel defining layer, an organic emission layer, a common electrode, and liquid crystal capsules. The pixel electrode and the control electrode are disposed on a substrate. The pixel defining layer exposes part of the pixel electrode and covers the control electrode. The organic emission layer is disposed on the pixel electrode. The common electrode covers the organic emission layer and the pixel defining layer. The liquid crystal capsules are dispersed in the pixel defining layer. The control electrode is positioned at substantially the same height as that of the pixel electrode.

According to an exemplary embodiment of the present invention, an organic light emitting diode (OLED) display includes a transmission region and a reflection region. When external light is incident on the OLED display, a reflection rate of the external light of the reflection region is proportional to luminance of the transmission region. The transmission region includes a pixel electrode, an organic emission layer, and a common electrode. The transmission region is configured to transmit light emitted from the organic emission layer to a first direction. The reflection region includes a control electrode, liquid crystal capsules, and the common electrode. The reflection region is configured to reflect the external light to the first direction.

BRIEF DESCRIPTION OF THE DRAWINGS

These and other features of the present invention will become more apparent by describing in detail exemplary embodiments thereof with reference to the accompanying drawings of which.

DETAILED DESCRIPTION OF THE EMBODIMENTS

Figure 1:
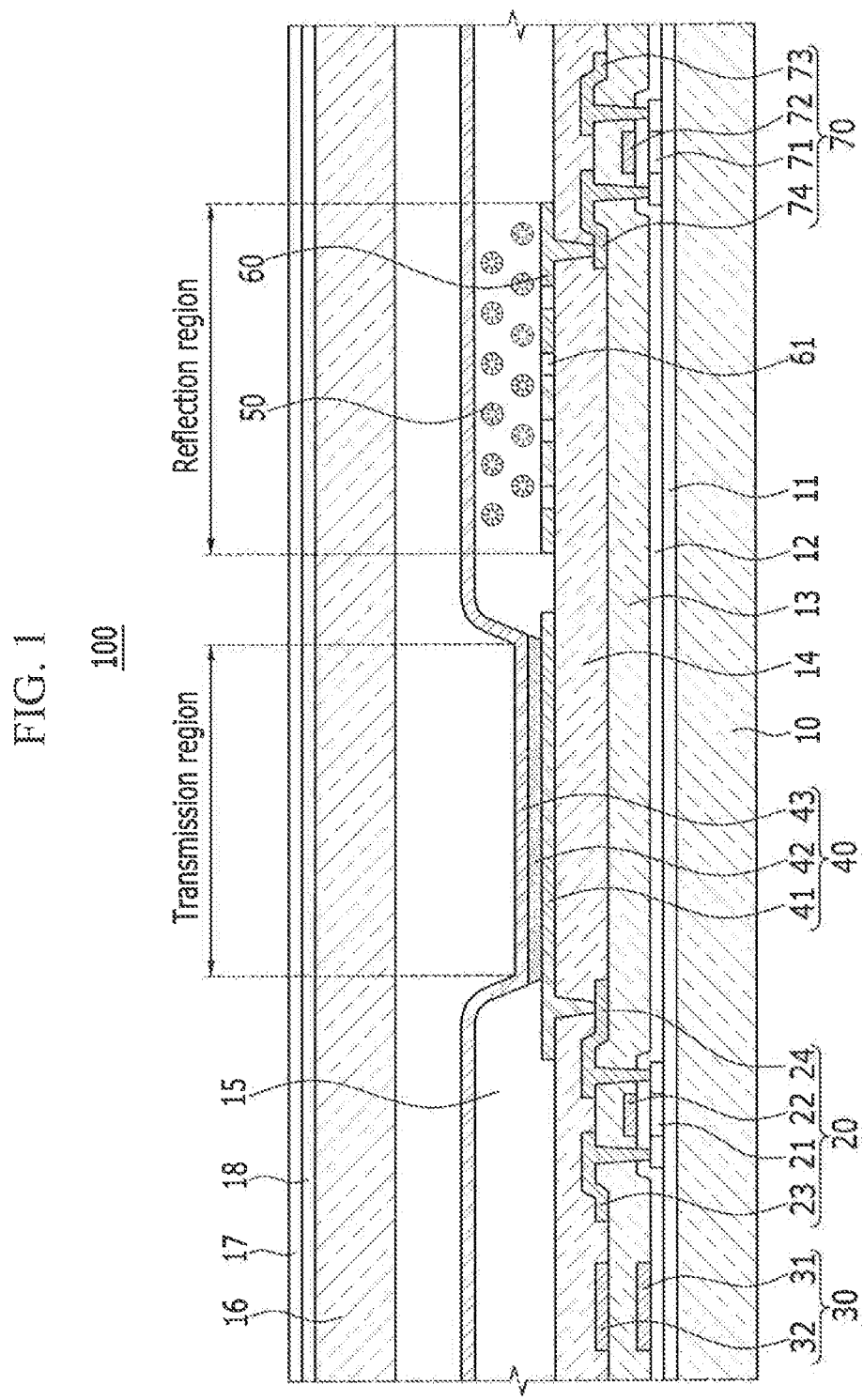
FIG. 1 is a cross-sectional view of an OLED display according to an exemplary embodiment of the present invention.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being on another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Figure 2:
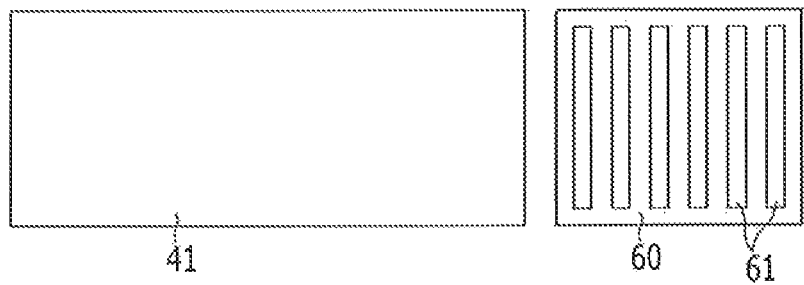
FIG. 2 is a top plan view of a pixel electrode and a control electrode of an OLED display according to an exemplary embodiment of the present invention.

FIG. 1 is a cross-sectional view of an organic light emitting diode (OLED) display according to an exemplary embodiment, and FIG. 2 is a top plan view of a pixel electrode and a control electrode of an OLED display according to an exemplary embodiment.

Referring to FIGS. 1 and 2, an OLED display 100 includes a substrate 10, pixel circuits 20 and 30 formed on the substrate 10, and an organic light emitting diode 40 of which operation is controlled by the pixel circuits 20 and 30. In addition, the OLED display 100 includes a plurality of liquid crystal capsules 50 and a control electrode 60 that controls alignment of liquid crystal molecules within the liquid crystal capsules 50.

The substrate 10 may be a rigid substrate such as glass or a flexible substrate such as a polymer film. A buffer layer 11 is formed on the substrate 10. The buffer layer 11 may be formed of an inorganic layer including, but is not limited to, $SiO_2$ or SiNx. The buffer layer 11 provides a flat surface for forming the pixel circuits 20 and 30, and serves to suppress permeation of moisture and foreign particles into the pixel circuits 20 and 30 and the organic light emitting diode 40.

The pixel circuit 20 may serve as a thin film transistor 20, and the pixel circuit 30 may serve as a capacitor 30. The thin film transistor 20 includes a semiconductor layer 21, a gate electrode 22, and source/drain electrodes 23 and 24. The semiconductor layer 21 may be formed of a polysilicon or oxide semiconductor, and includes a channel area in which impurities are not doped and a source area and a drain area in which impurities are doped at respective sides of the channel area. When the semiconductor layer 21 is formed of the oxide semiconductor, a separate protective layer for protecting the semiconductor layer 21 may be added.

A gate insulating layer 12 is formed between the semiconductor layer 21 and the gate electrode 22, and an interlayer insulating layer 13 is formed between the gate electrode 22 and the source/drain electrodes 23 and 24. The thin film transistor 20 includes a top gate structure but the structure of the thin film transistor 20 is not limited thereto.

The capacitor 30 includes a first capacitor plate 31 formed on the gate insulating layer 12 and a second capacitor plate 32 formed on the interlayer insulating layer 13. The first capacitor plate 31 may be made of substantially the same material as the gate electrode 22, and the second capacitor plate 32 may be made of substantially the same material as the source/drain electrodes 23 and 24. The second capacitor plate 32 may be connected to the source electrode 23.

The thin film transistor 20 serves as a driving thin film transistor. The OLED display 100 may further include switching thin film transistors (not shown). The switching thin film transistor may serve as a switching element that selects a pixel to emit light, and the driving thin film transistor supplies power to the selected pixel.

Here, the pixel implies a minimum unit of light emission, and the pixel circuit; 20 and 30 include at least a driving thin film transistor and a switching thin film transistor and at least one capacitor 30. The OLED display 100 includes a plurality of pixels, and an image is displayed using light emitted from the respective pixels. The plurality of pixels each has the same structure. For the convenience of description, an exemplary pixel is shown in FIG. 1.

A planarization layer 14 is formed on the source/drain electrodes 23 and 24 and the second capacitor plate 32. The planarization layer 14 may include an organic material including, but is not limited to, benzocyclobutene (BCB), an acryl resin, an epoxy resin, or a phenol resin. Alternatively, the planarization layer 14 may include an inorganic material such as SiNx. A via hole penetrates the planarization layer 14, to partially expose the drain electrode 24. The organic light emitting diode 40 is formed on the planarization layer 14.

The organic light emitting diode 40 includes a pixel electrode 41, an organic emission layer 42, and a common electrode 43. The pixel electrode 41 is formed in each pixel, and is connected to the drain electrode 24 of the thin film transistor 20. The pixel electrode 41 is exposed using a pixel defining layer 15 defining pixel areas, and the organic emission layer 42 is formed on the exposed pixel electrode 41. The common electrode 43 is formed on the organic emission layer 41. For example, the common electrode is formed, throughout the display area, on the organic emission layer 42 and the pixel defining layer 15.

The emission layer 42 may be one of a red emission layer, a green emission layer, and a blue emission layer. Alternatively, the organic emission layer 42 may be a white emission layer, or may be formed in a layered structure of a red emission layer, a green emission layer, and a blue emission layer. When the organic emission layer 42 emits light of a white color, the OLED display may further include a color filter (not shown).

One of the pixel electrode 41 and the common electrode 43 serves as an anode for injecting holes to the organic emission layer 42, and the other serves as a cathode for injecting electrons to the organic emission layer 42. Holes injected from the anode and electrons injected from the cathode are combined in the organic emission layer 42 to generate excitons, and light is emitted when the excitons discharge energy.

At least one of a hole injection layer and a hole transport layer may be provided between the anode and the organic emission layer 42. At least one of the electron injection layer and the electron transport layer may be provided between the cathode and the organic emission layer 42.

The pixel electrode 41 may be formed of a metal reflective layer, and the common electrode 43 may be formed of a semi-transmissive or transparent conductive layer. Light emitted from the organic emission layer 42 is reflected from the pixel electrode 41 and thus, the reflected light is emitted to the outside through the common electrode 43. When the common electrode 43 is formed of a semi-transmissive layer, light emitted from the organic emission layer 42 is partially reflected to the pixel electrode 41, thereby being resonated between the pixel electrode 41 and the common electrode 43. The semi-transmissive layer may be a metal layer having a thickness of less than about 200 nm, and the transparent conductive layer may be formed of a transparent metal oxide such as indium tin oxide (ITO).

The control electrode 60 is formed in each pixel. The control electrode 60 is interposed between the planarization layer 14 and the pixel defining layer 15. The control electrode 60 is formed using a material that is substantially the same as that of the pixel electrode 41. The control electrode 60 is formed at substantially the same height as that of the pixel electrode 41. For example, the control electrode 60 may be formed of metal reflective layer. The control electrode 60 and the pixel electrode 41 may be simultaneously formed in a process of manufacturing the OLED display 100. The control electrode 60 is spaced apart from the pixel electrode 41. The control electrode 60 need not be electrically connected to the pixel electrode 41.

Referring to FIG. 2, the pixel electrode 41 and the control electrode 60 have different shapes from each other. For example, the control electrode 60 includes a plurality of slits 61.

The control electrode 60 may be spaced apart from at least one edge of the pixel electrode 41. In FIG. 2, the control electrode 60 is spaced apart from the right side edge of the pixel electrode 41, but when a sufficient gap is provided between pixel electrodes 41 in two neighboring pixel areas, the control electrode 60 may be spaced apart from two or three edges of the pixel electrode 41, surrounding the pixel electrode 41.

The pixel defining layer 15 covers the edge of the pixel electrode 41 and the control electrode 60. The plurality of liquid crystal capsules 50 are dispersed in the pixel defining layer 15 that covers the control electrode 60. Each liquid crystal capsule 50 may be formed of liquid crystal molecules and a polymer layer surrounding the liquid crystal molecules. The liquid crystal capsule 50 will be described later with reference to FIGS. 3A and 3B. The plurality of liquid crystal capsules 50 may be irregularly arranged or arranged in a constant direction in the pixel defining layer 15.

Figure 3A:
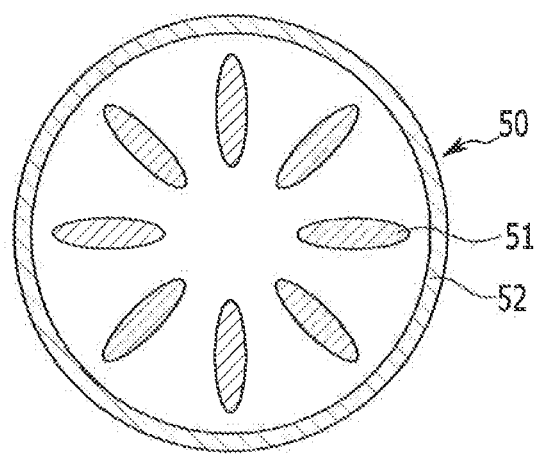
FIG. 3A and FIG. 3B are schematic diagrams illustrating a liquid crystal capsule of an OLED display according to an exemplary embodiment of the present invention.
Figure 3B:
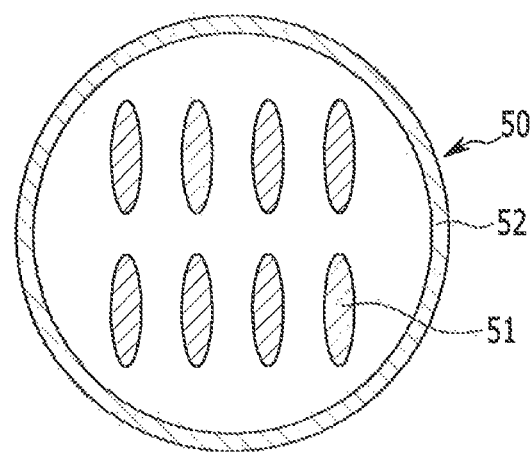

When an electric field is not applied, the liquid crystal molecules in the liquid crystal capsules 50 may be arranged in various shapes such as a radial shape, a bipolar shape, a coaxial shape, and the like, or may be irregularly arranged in a random direction. FIG. 3A and FIG. 3B are schematic diagrams illustrating liquid crystal capsules of an OLED display according to an exemplary embodiment.

Referring to FIG. 3A, each liquid crystal capsule 50 includes liquid crystal molecules 51 arranged in a radial direction. Referring to FIG. 3B, each liquid crystal capsule 50 includes liquid crystal molecules 51 arranged in a vertical direction (e.g., a thickness direction of the substrate 10). In FIG. 3A and FIG. 3B, reference numeral 52 denotes a polymer layer. The alignment structure of the liquid crystal molecules 51 is not limited thereto, and the liquid crystal molecules 51 may be aligned in various manners.

Referring to FIG. 1, the liquid crystal capsules 50 may have a nano-scale size (greater than 1 nm and less than 1000 nm). For example, the liquid crystal capsules 50 may be larger than the diameter of the liquid crystal molecules 51 and may be smaller than the shortest wavelength of a visible ray for light transmission. The wavelength of the visible ray range between about 380 nm to about 770 nm, and therefore the liquid crystal capsule 50 may have a diameter greater than about 10 nm and less than about 380 nm.

For the liquid crystal capsule 50 having less than about 10 nm in diameter, the polymer layer 52 of the liquid crystal molecules 51 may prevent the liquid crystal molecules 51 from being freely aligned along the direction of an electric field that is applied to the liquid crystal molecules 51. For the liquid crystal capsule 50 having more than about 380 nm in diameter, the visible rays may be scattered in the boundary of the liquid crystal capsules 50, and thus an additional material may be needed to prevent scattering of the visible rays. When the diameter of the liquid crystal capsules 50 ranges between about 10 nm to about 380 nm, an alignment direction of the liquid crystal molecules 51 may be easily controlled and light scattering may be suppressed.

The liquid crystal molecules 51 may have a negative dielectric anisotropy for gray expression and on/off realization. When an electric field is not applied, a black mode may be realized so that the liquid crystal capsules 50 are in the black state. Alternative, the liquid crystal molecules 51 may have a positive dielectric anisotropy.

The OLED display 100 according to an exemplary embodiment includes the control electrode 60 and the liquid crystal capsules 50 and thus the OLED display 100 may control the amount of reflection of the external light by changing alignment of the liquid crystal molecules 51 using a voltage difference between the control electrode 60 and the common electrode 43. In this case, the amount of reflection of external light is controlled to be proportional to luminance of the corresponding pixel. The control electrode 60 is electrically connected to a thin film transistor 70 configured to apply an electric field to liquid crystal molecules of the liquid crystal capsules 50.

The liquid crystal driving thin film transistor 70 includes a semiconductor layer 71, a gate electrode 72, and source drain electrodes 73 and 74, and the control electrode 60 is connected to the drain electrode 74. The liquid crystal driving thin film transistor 70 may have substantially the same structure as the thin film transistor 20.

Referring to FIG. 1, an encapsulation substrate 16 is formed on the common electrode 43. The encapsulation substrate 16 may be formed of transparent glass or a transparent polymer film. The encapsulation substrate 16 serves to seal the organic light emitting diode 40 from external air, and thus suppressing deterioration of the organic light emitting diode 40 due to moisture and oxygen included in the external Alternatively, a thin film encapsulation layer may be formed on the common electrode 43. The thin film encapsulation layer may include a plurality of organic layers and a plurality of inorganic layers that are alternately stacked on each other.

A polarizing plate 17 and a ¼ wavelength plate 18 are formed on the encapsulation substrate 16. The ¼ wavelength plate 18 is disposed on the encapsulation substrate 16. The polarizing plate 17 is disposed on the ¼ wavelength plate 18. As a linear polarizing plate, the polarizing plate 17 converts external light vibrating in a random direction to linearly polarized light vibrating in parallel to a transmissive axis of the polarizing plate 17. The ¼ wavelength plate 18 shifts polarized light from incident light by 90° (λ/4). The polarizing plate 17 and the ¼ wavelength plate 18 of the OLED display 100 prevent external light from being reflected from the OLED display 100.

Figure 4:
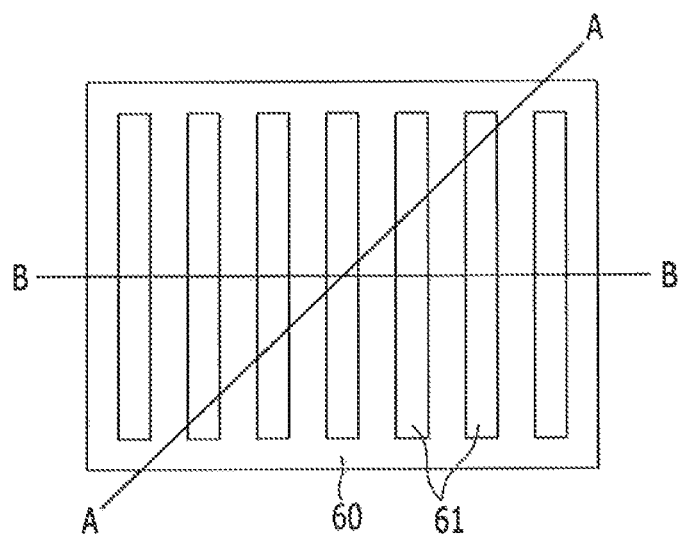
FIG. 4 is a top plan view of a control electrode of an OLED display according to an exemplary embodiment of the present invention.

FIG. 4 is a top plan view of a control electrode of an OLED display according to an exemplary embodiment. The control electrode 60 of FIG. 1 may be implemented using the control electrode of FIG. 4. For the convenience of description, transmissive axis of the polarizing plate and a main axis of the ¼ wavelength plate are illustrated together.

Referring to FIGS. 1 and 4, the control electrode 60 includes slits 61 having a stripe pattern, and a transmissive axis A-A of the polarizing plate 17 crosses the slits 61 at an angle of about 45°. In addition, the main axis (B-B) of the ¼ wavelength plate 18 crosses the slits 61 at an angle of about 90°. Under such configuration of the control electrode 60, the polarizing plate 17 and the ¼ wavelength plate 18, a reflection rate of external light using the control electrode 60 and the liquid crystal capsule 50 may be maximized.

Referring to FIG. 1, each pixel of the OLED display 100 includes a transmission region having the organic emission layer 42 and a reflection region having the control electrode 60 and the liquid crystal capsule 50. The transmission region transmits light emitted from the organic emission layer 42 to the outside, thereby displaying an image. The reflection region controls a reflection rate of external light incident on the OLED display 100 using the liquid crystal molecules 51. The liquid crystal molecules 51 serve to change a phase of light according to an electric field applied to the liquid crystal capsule 50, thereby controlling the reflection rate of external light.

Figure 5:
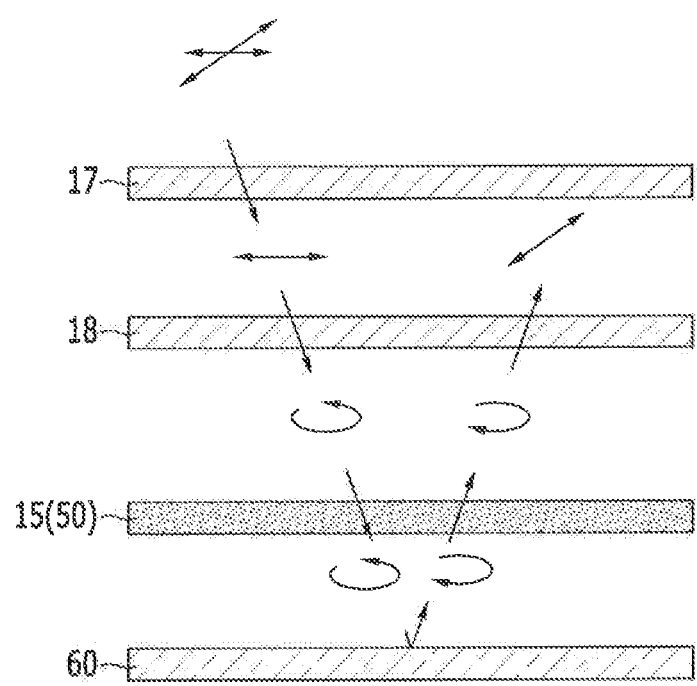
FIG. 5 is a schematic diagram illustrating phase changes of external light when an OLED display is in a black mode according to an exemplary embodiment of the present invention.

FIG. 5 is a schematic diagram illustrating phase changes of external light when an OLED display is in a black mode according to an exemplary embodiment.

Referring to FIGS. 1 and 5, the polarizing plate 17 receives external, unpolarized light and transmits polarized light vibrating only in a direction parallel Co the transmissive axis thereof. For example, the polarizing plate 17 linearly polarizes the external light. The ¼ wavelength plate 18 circularly polarizes the linearly polarized external light clockwise or counterclockwise. The transmissive axis of the polarizing plate 17 crosses the main axis of the ¼ wavelength plate 18 at an angle of about 45°.

In the off state, the liquid crystal capsule 50 does not serve as a phasor, and therefore the circularly polarized light passes through the liquid crystal capsules 50, and the control electrode 60 reflects the circularly polarized light. A polarization direction of the circularly polarized light is changed after being reflected. For example, clockwise-circularly polarized light is changed to counterclockwise-circularly polarized light, and counterclockwise-circularly polarized light is changed to clockwise-circularly polarized light.

The circularly polarized light reflected by the control electrode 60 passes through the liquid crystal capsules 50 and changes to linearly polarized light when passing through the ¼ wavelength plate 18. In this case, a vibration direction of the linearly polarized light is perpendicular to the transmissive axis of the polarizing plate 17, and therefore the polarizing plate 17 prevents the linearly polarized light from passing through the polarizing plate 17. As described, when the OLED display 100 operates in a black mode, an electric field is not applied to the liquid crystal capsules 50. The OLED display 100, in a black mode, does not reflect external light. The phase changes of external light as shown in FIG. 5 is applied to the transmission region in a like manner. For example, external light incident to the transmission region is not transmitted to the outside and is blocked by the ¼ wavelength plate 18.

The off state of the liquid crystal capsule 50 may occur when a voltage applied to the control electrode 60 is substantially equal to a power voltage ELVSS applied to the common electrode 43.

Figure 6:
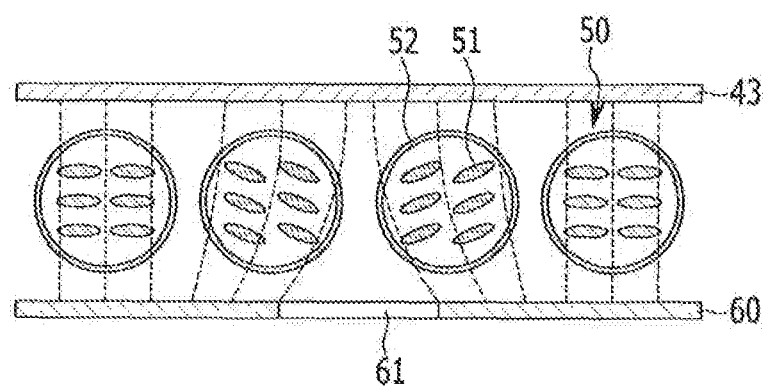
FIG. 6 is a schematic diagram illustrating a liquid crystal capsule according to an exemplary embodiment of the present invention.

FIG. 6 is a schematic diagram of the case that the liquid crystal capsules are in the on state in the reflection region of FIG. 1. The on state of the liquid crystal capsule 50 may occur when be defined as a state that the liquid crystal molecules 51 have voltages higher than a threshold voltage with respect to the power voltage ELVSS of the common electrode 43. (The on state of the liquid crystal capsule 50 may occur when a voltage applied to the control electrode 60 is higher than a power voltage ELVSS applied to the common electrode 43.)

Referring to FIG. 6, when the liquid crystal capsule 50 is in on state, the liquid crystal molecules 51 serve as a phasor. For example, when the liquid crystal molecules 61 are aligned along a direction that the slit 61 of the control electrode 60 is extended, the liquid crystal molecules 61 serve as a phasor changing a phase of polarization. For the liquid crystal molecules 51 having negative dielectric anisotropy where a dielectric constant of a short axial direction is greater than a dielectric constant of a long axial direction, molecule axes (long axes) of the liquid crystal molecules 51 are arranged to be perpendicular to an electric field direction (marked by the dotted lines).

As a voltage difference between the control electrode 60 and the common electrode 43 is increased, phase shift by the liquid crystal molecules 51 is increased, and the reflection region has the maximum reflection rate of external light in a voltage condition when the phase shift by the liquid crystal molecules 51 is about 90° ($\lambda/4$).

Figure 7:
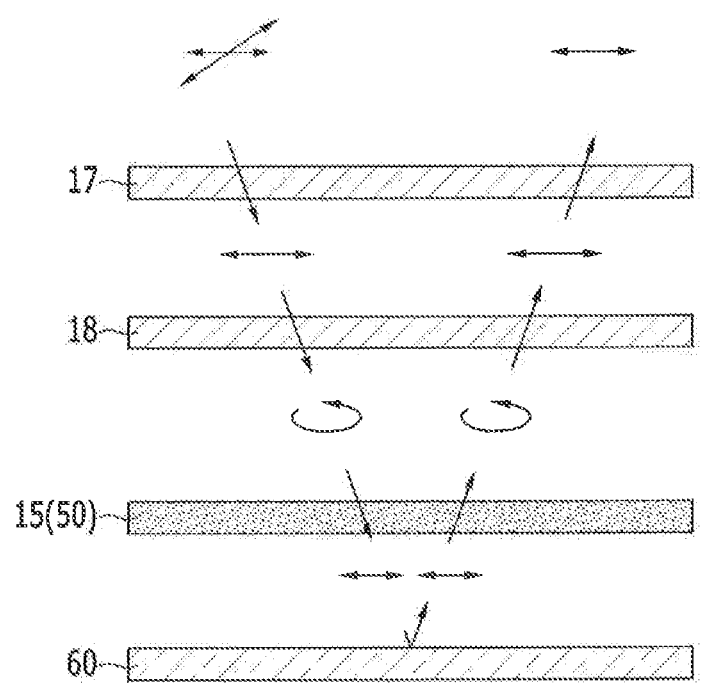
FIG. 7 is a schematic diagram illustrating phase changes of external light when an OLED display is in a white mode according to an exemplary embodiment of the present invention.

FIG. 7 is a schematic diagram illustrating phase changes of external light when an OLED display is in a white mode according to an exemplary embodiment.

Referring to FIGS. 1 and 7, the polarizing plate 17 linearly polarizes external light, and the ¼ wavelength plate 18 converts the linearly polarized external light to circularly polarized light. The main axis of the ¼ wavelength plate 18 and the pattern direction of the control electrode 60 are perpendicular to each other, and therefore the liquid crystal capsules 50 delay the circularly polarized light in phase by about 90°, changing the circularly polarized light to linearly polarized light. Then, the linearly polarized light is reflected by the control electrode 60.

The liquid crystal capsules 50 converts the linearly polarized light reflected from the control electrode 60 to circularly polarized light, and the circularly polarized light is linearly polarized when passing through the ¼ wavelength plate 18. In this case, in the liquid crystal capsules 50, the circularly polarized light incident to the ¼ wavelength plate 18 has substantially the same rotation direction as the circularly polarized light incident to the liquid crystal capsules 50. The ¼ wavelength plate 18 converts the circularly polarized light incident to the ¼ wavelength plate 18 to a linearly polarized light that is parallel to the transmissive axis of the polarizing plate 17. The linearly polarized light by the ¼ wavelength plate 18 passes through the polarizing plate 17.

External light incident on the OLEO display 100 is reflected when the liquid crystal capsules 50 are in the on state when an electric field is applied to the liquid crystal capsules 50. The OLED display 100 is in a white mode when the OLED display 100 reflects external light. FIG. 7 illustrates a case that the voltage difference between the control electrode 60 and the common electrode 43 is set to be maximum so that phase shift by the liquid crystal molecules 51 is 90° ($\lambda/4$).

The reflection region of the OLED display 100 has a reflection rate of external light that is proportional to luminance of the transmission region. The liquid crystal driving thin film transistor 70 applies a driving voltage to the control electrode such that a voltage difference between the common electrode 43 and the control electrode is proportional to luminance of the corresponding pixel, thus the reflection rate of the reflection region changes according to the luminance of the corresponding transmission region. The power voltage ELVSS is supplied to the common electrode 43. The driving voltage is supplied to the control electrode. A pixel voltage is supplied to the pixel electrode 41.

Due to reflection of external light from the reflection region, luminance of each pixel corresponds to the sum of luminance of the reflection region and luminance of the transmission region. Therefore, the OLED display 100 according to an exemplary embodiment increases outdoor visibility using external light without increasing power consumption.

The plurality of slits 61 distorts the electric field, and alignment of the liquid crystal molecules 51 is locally changed along the distorted electric field direction such that a multi-domain is formed. For example, an inclination angle of the liquid crystal molecules 51 that are distant from the slits 61 is different from an inclination angle of the liquid crystal molecules 51 that is close to the slits 61. Such formation of the multi-domain increases a viewing angle of the reflection light.

Figure 8:
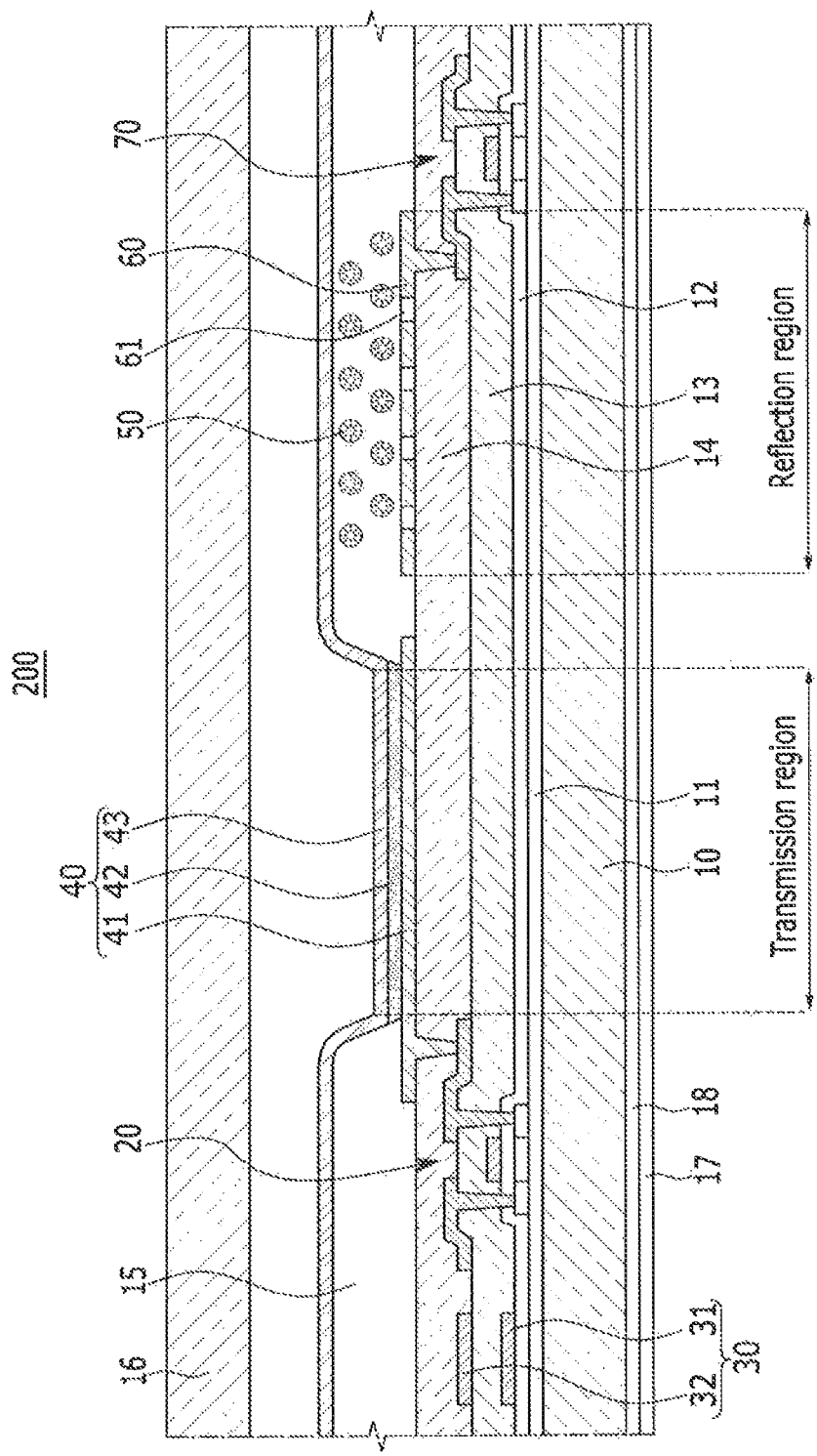
FIG. 8 is a cross-sectional view of an OLED display according to an exemplary embodiment of the present invention.

FIG. 8 is a cross-sectional structure of an OLED display according to an exemplary embodiment.

Referring to FIG. 8, an OLED display 200 is substantially similar to the OLED display of FIG. 1, except that the OLED display 200 is a bottom emission type of OLED display. The same reference numerals are used for the same components as those of the exemplary embodiment of FIG. 1.

The common electrode 43 is formed of a metal reflective layer, and the pixel electrode 41 and the control electrode 60 are formed of a semi-transmissive or transparent conductive layer. Light emitted from the organic emission layer 42 is reflected by the common electrode 43, and then emitted to the outside through the pixel electrode 41.

The display side of the OLED display 200 is the bottom side of the substrate 10, and the ¼ wavelength plate 18 and the polarizing plate 17 are attached to the bottom surface of the substrate 10. Operations of the transmission region and the reflection region are substantially the same as the exemplary embodiment of FIG. 1, and for the convenience of description, no further description will be provided.

External light reflected from the reflection region increases luminance of each pixel, and thus when an OLED display is used outdoor, the visibility of the OLED display increases without increasing power consumption.

While the present invention has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. An organic light emitting diode (OLED) display comprising:
   a pixel electrode disposed on a substrate;
   a control electrode disposed on the substrate;
   a pixel defining layer exposing part of the pixel electrode and covering the control electrode;
   an organic emission layer disposed on the pixel electrode;

a common electrode covering the organic emission layer and the pixel defining layer; and a plurality of liquid crystal capsules dispersed in the pixel defining layer, wherein the control electrode is positioned at substantially the same height as that of the pixel electrode, and wherein the control electrode includes a plurality of slits.

2. The OLED display of claim 1, wherein the control electrode is spaced apart from at least one edge of the pixel electrode.

3. The OLED display of claim 1, wherein the common electrode receives a power voltage, and the control electrode receives a driving voltage from a liquid crystal driving thin film transistor, wherein a voltage difference between the common electrode and the control electrode is proportional to a voltage difference between the common electrode and the pixel electrode for luminance of the transmission region.

4. The OLED display of claim 1, wherein the pixel electrode and the control electrode are formed of a reflective layer, the common electrode is formed of a semi-transmissive layer or a transparent conductive layer, and a ¼ wavelength plate and a polarizing plate are disposed on the common electrode so that the common electrode is disposed between the polarizing plate and the substrate.

5. The OLED display of claim 4, wherein the polarizing plate is arranged such that a transmission axis of the polarizing plate crosses the plurality of slits of the control electrode at an angle of about 45°, and the ¼ wavelength plate is arranged such that a main axis of the ¼ wavelength plate crosses the plurality of slits of the control electrode at an angle of about 90°.

6. The OLED display of claim 1, wherein the pixel electrode and the control electrode are formed of a semi-transmissive layer or a transparent conductive layer, the common electrode is formed of a reflective layer, and a ¼ wavelength plate and a polarizing plate are disposed on the substrate so that the substrate is disposed between the common electrode and the polarizing plate.

7. The OLED display of claim 6, wherein
the polarizing plate is arranged such that a transmission axis of the polarizing plate crosses the plurality of slits of the control electrode at an angle of about 45°, and the ¼ wavelength plate is arranged such that a main axis of the ¼ wavelength plate crosses the plurality of slits of the control electrode at an angle of about 90°.

8. The OLED display of claim 1, wherein the plurality of liquid crystal capsules respectively comprise liquid crystal molecules, and a polymer layer surrounding the liquid crystal molecules.

9. The OLED display of claim 8, wherein the liquid crystal molecules have negative dielectric anisotropy.

10. The OLED display of claim 8, wherein each of the plurality of liquid capsules has a diameter of about 10 nm to about 380 nm.

11. An organic light emitting diode (OLED) display comprising:
a transmission region including a pixel electrode, an organic emission layer, and a common electrode and configured to transmit light emitted from the organic emission layer to a first direction; and a reflection region including a control electrode, liquid crystal capsules, and the common electrode and configured to reflect external light incident on the OLED display to the first direction, wherein a reflection rate of the external light of the reflection region is proportional to luminance of the transmission region, wherein the control electrode includes a plurality of slits.

12. The OLED display of claim 11, wherein the control electrode is formed of substantially the same material as that of the pixel electrode, wherein the control electrode is positioned at substantially the same height as that of the pixel electrode.

13. The OLED display of claim 12, wherein the common electrode receives a power voltage, and the control electrode receives a driving voltage from a liquid crystal driving thin film transistor, wherein a voltage difference between the common electrode and the control electrode is proportional to a voltage difference between the common electrode and the pixel electrode for luminance of the transmission region.

14. The OLED display of claim 12, further comprising a ¼ wavelength plate and a polarizing plate configured to receive the emitted light and the reflected external light and provided throughout the transmission region and the reflection region, and
wherein the polarizing plate is arranged such that a transmission axis of the polarizing plate crosses the plurality of slits of the control electrode at an angle of about 45°, and the ¼ wavelength plate is arranged such that a main axis of the ¼ wavelength plate crosses the plurality of slits of the control electrode at an angle of about 90°.

15. The OLED display of claim 12, further comprising a pixel defining layer exposing part of the pixel electrode and covering the control electrode,
wherein the plurality of liquid crystal capsules are dispersed in the pixel defining layer.

16. The OLED display of claim 15, wherein each of the plurality of liquid crystal capsules comprises liquid crystal molecules and a polymer layer surrounding the liquid crystal molecules.

17. The OLED display of claim 16, wherein the liquid crystal molecules have negative dielectric anisotropy.

18. The OLED display of claim 16, wherein each of the plurality of liquid crystal capsules has a diameter of about 10 nm to about 380 nm.

* * * * *